(12) United States Patent
Yamada

(10) Patent No.: US 8,700,964 B2
(45) Date of Patent: Apr. 15, 2014

(54) TEST APPARATUS AND SYNCHRONIZATION METHOD

(75) Inventor: Tatsuya Yamada, Saitama (JP)

(73) Assignee: Advantest Corporation, Tokyo (JP)

( * ) Notice: Subject to any disclaimer, the term of this patent is extended or adjusted under 35 U.S.C. 154(b) by 548 days.

(21) Appl. No.: 13/029,065

(22) Filed: Feb. 16, 2011

(65) Prior Publication Data

US 2011/0161763 A1  Jun. 30, 2011

Related U.S. Application Data

(63) Continuation of application No. PCT/JP2009/004607, filed on Sep. 15, 2009.

(30) Foreign Application Priority Data

Sep. 17, 2008  (JP) ................... 2008-237414

(51) Int. Cl.
*G01R 31/28* (2006.01)
(52) U.S. Cl.
USPC ......................................... 714/744; 714/731
(58) Field of Classification Search
USPC ................................................ 714/744, 731
See application file for complete search history.

(56) References Cited

U.S. PATENT DOCUMENTS

| 2004/0239310 A1 | 12/2004 | Oshima et al. |
| 2005/0210341 A1 | 9/2005 | Chiba et al. |
| 2007/0040564 A1 | 2/2007 | Le et al. |
| 2007/0283183 A1 | 12/2007 | Komoto |

FOREIGN PATENT DOCUMENTS

| JP | 2004-361343 A | 12/2004 |
| JP | 2008/118179 A | 5/2008 |
| WO | 03/062843 A1 | 7/2003 |
| WO | 2006/087806 A1 | 8/2006 |
| WO | 2007/015580 A1 | 2/2007 |

OTHER PUBLICATIONS

Written Opinion (PCT/ISA/237) issued in PCT/JP20091004607 (parent application) mailed in Dec. 2009.
International Search Report (ISR) issued in PCT/JP2009/004607 (parent application) mailed in Dec. 2009 for Examiner consideration.

*Primary Examiner* — James C Kerveros

(57) ABSTRACT

A test apparatus that tests a device under test, including (i) a master domain that includes a master period signal generating section, which generates a master period signal, where the master domain operates based on the master period signal and (ii) a slave domain that includes a slave period signal generating section, which generates a slave period signal, where the slave domain operates based on the slave period signal. The master period signal generating section receives a control signal and resumes generation of the master period signal, which is on hold, and the slave period signal generating section receives the control signal, initializes phase data of the slave period signal, and resumes generation of the slave period signal, which is on hold.

9 Claims, 3 Drawing Sheets

TEST APPARATUS AND SYNCHRONIZATION METHOD

BACKGROUND

1. Technical Field

The present invention relates to a test apparatus and a domain synchronization method.

2. Related Art

Patent Document 1, for example, discloses a test apparatus comprising a reference clock generating section that generates a reference clock having a first frequency, a first test rate generating section that generates a first test rate clock having a frequency that is substantially an integer multiple of the first frequency, a second test rate generating section that generates a second test rate clock having a frequency that is different from the frequency of the first test rate clock, a first driver that supplies an electronic device with a test pattern according to the first test rate clock, and a second driver that supplies the electronic device with a test pattern according to the second test rate clock. Patent Document 1 further discloses that the domains are synchronized with each other at a start time in the test apparatus.

Patent Document 1: International Publication WO 2003/062843

The test apparatus can achieve synchronization between domains at a start time. However, in order to achieve synchronization of the domains during operation, there is a prescribed limitation. Specifically, a timing must be found that is a common multiple of the phases of the operational clock and the period signal, and synchronization must be achieved at the timing that is a common multiple of the phases of the operational clock and period signal of each domain that is to be synchronized. This requirement imposes a limitation when creating the pattern program, and makes creation of the pattern program more complicated. Accordingly, a synchronization method is desired that does not impose many restrictions on the pattern program creation.

SUMMARY

Therefore, it is an object of an aspect of the innovations herein to provide a test apparatus and a domain synchronization method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test, comprising (i) a master domain that includes a master period signal generating section, which generates a master period signal, and that operates based on the master period signal and (ii) a slave domain that includes a slave period signal generating section, which generates a slave period signal, and that operates based on the slave period signal. The master period signal generating section receives a control signal and resumes generation of the master period signal, which is being held, and the slave period signal generating section receives the control signal, initializes phase data of the slave period signal, and resumes generation of the slave period signal, which is being held.

The slave period signal generating section may include a phase data counter that counts the phase data; a period memory that stores period data indicating a period of the slave period signal; a first judgment processing section that judges whether the phase data fulfills a first condition, which is that the phase data be greater than or equal to an operational clock period of the slave period signal generating section and no greater than double the operational clock period, and, if the first condition is fulfilled, generates a period pulse signal and adds the period data to the phase data; a second judgment processing section that judges whether the phase data fulfills a second condition, which is that the phase data not be zero, and, if the second condition is fulfilled, subtracts the operational clock period from the phase data; a data output section that outputs a remainder resulting from the phase data being divided by the operational clock period; and a stop/resume control section that receives a hold signal to stop output of the period pulse signal, and receives a control signal to start or resume output of the period pulse signal and to initialize the phase data counter. Upon receiving the control signal, the master period signal generating section may resume generation of the master period signal that was being held, without initializing phase data of the master period signal. The master period signal generating section and the slave period signal generating section may receive the control signal at a timing that is a common multiple of (i) a period of the master period signal and (ii) a common multiple frequency of the operational clocks of the master period signal generating section and the slave period signal generating section. The test apparatus may comprise a plurality of the master period signal generating sections, and the master period signal generating sections and the slave period signal generating section may receive the control signal at a timing that is a common multiple of (i) a period of the master period signal and (ii) a common multiple frequency of the operational clocks of the slave period signal generating section and each master period signal generating section.

According to a second aspect related to the innovations herein, provided is a domain synchronization method performed by a test apparatus that tests a device under test. The test apparatus includes (i) a master domain that has a master period signal generating section, which generates a master period signal, and that operates based on the master period signal and (ii) a slave domain that has a slave period signal generating section, which generates a slave period signal, and that operates based on the slave period signal. The domain synchronization method comprises supplying a control signal to the master period signal generating section and the slave period signal generating section; and upon receiving the control signal, causing the master period signal generating section to resume generation of the master period signal and causing the slave period signal generating section to initialize phase data of the slave period signal and to resume generation of the slave period signal.

The domain synchronization method may further comprise, prior to supplying the control signal, supplying a hold signal, which stops the master period signal and the slave period signal, to the master period signal generating section and the slave period signal generating section. The domain synchronization method may further comprise confirming that the master period signal and slave period signal have stopped according to the supplying of the hold signal. Supplying the control signal may include supplying the control signal at a timing that is a common multiple of (i) a period of the master period signal and (ii) a common multiple frequency of the operational clocks of the master period signal generating section and the slave period signal generating section.

The summary clause does not necessarily describe all necessary features of the embodiments of the present invention. The present invention may also be a sub-combination of the features described above.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
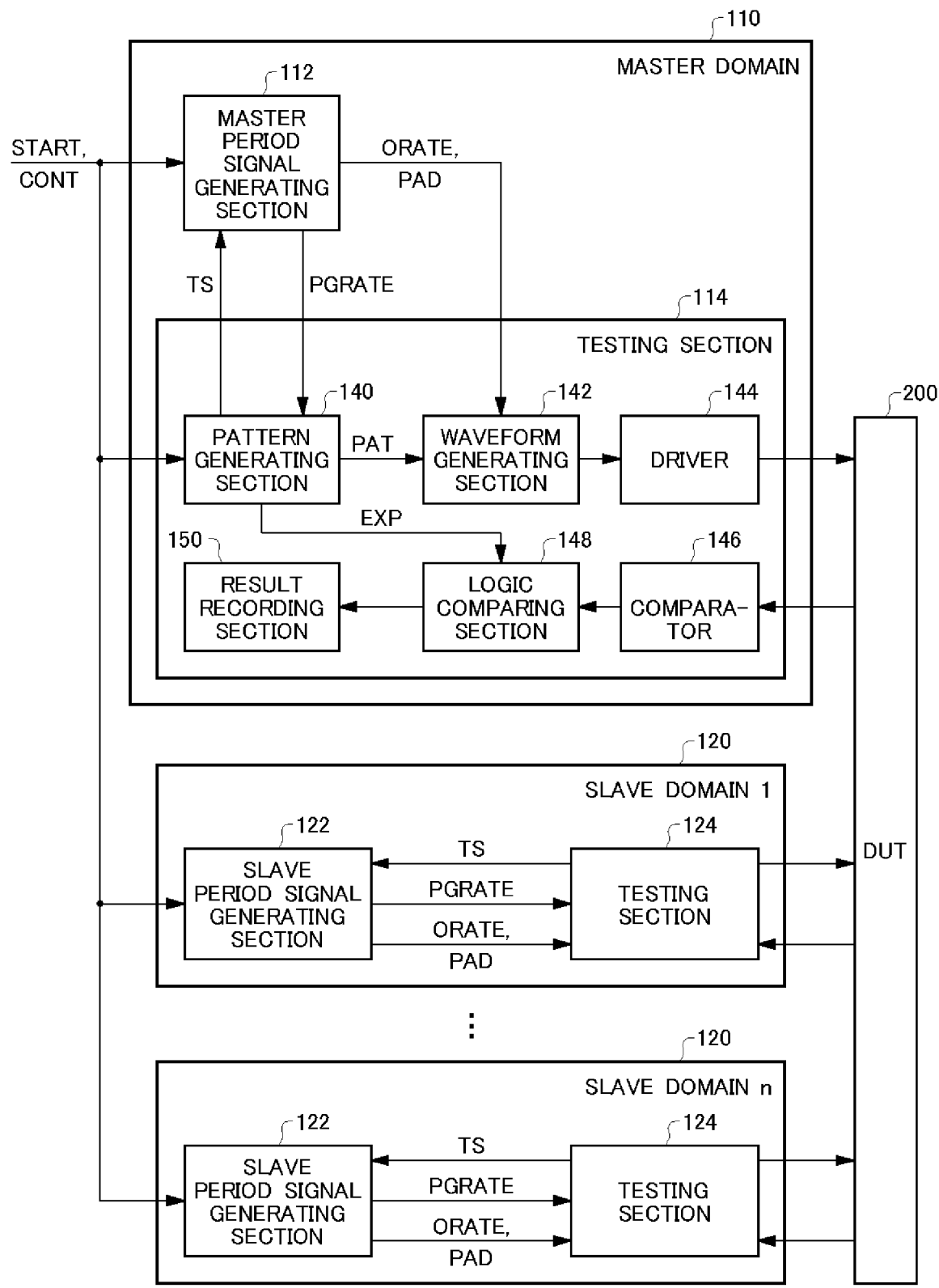
FIG. 1 shows an exemplary block configuration of a test apparatus 100 according to the present invention, along with a device under test (DUT) 200.

FIG. 1 shows an exemplary block configuration of a test apparatus 100 according to the present invention, along with a device under test (DUT) 200. The test apparatus 100 tests the device under test 200. The test apparatus 100 includes a master domain 110 and a plurality of slave domains 120. The master domain 110 includes a master period signal generating section 112 and a testing section 114, and operates according to a master period signal. The slave domains 120 each include a slave period signal generating section 122 and a testing section 124, and operate according to a slave period signal.

The master period signal generating section 112 generates the master period signal. The master period signal generating section 112 receives a continuation signal CONT, which is an example of a control signal, and resumes generation of the master period signal that was on hold. A plurality of master period signal generating sections 112 may be provided. Each slave period signal generating section 122 generates the slave period signal. Each slave period signal generating section 122 receives the continuation signal CONT, which is an example of a control signal, sets the phase data of the slave period signal to an initial state, and resumes the generation of the slave period signal that was on hold.

The testing section 114 and the testing sections 124 in each domain test the device under test 200. Here, the test functions of the testing section 114 and the testing sections 124 are shown as examples of the domain functions, but the functions of the domains are not limited to test functions. For example, each domain may have a function to supply a test period to the device under test 200, or a function for generating a synchronization signal to synchronize the domains with each other. The testing section 114 and the testing sections 124 have the same configuration, and therefore the following describes only the testing section 114. The testing section 114 includes a pattern generating section 140, a waveform generating section 142, a driver 144, a comparator 146, a logic comparing section 148, and a result recording section 150.

The pattern generating section 140 receives a period pulse signal PGRATE from the master period signal generating section 112, and generates a test pattern PAT and an expected value pattern EXP. The generated test pattern PAT and expected value pattern EXP are respectively supplied to the waveform generating section 142 and the logic comparing section 148. The pattern generating section 140 supplies a timing setting TS to the master period signal generating section 112.

The waveform generating section 142 generates a test waveform according to a period pulse signal ORATE and remainder data PAD from the master period signal generating section 112, based on the test pattern PAT from the pattern generating section 140. The driver 144 supplies the device under test 200 with the test waveform generated by the waveform generating section 142.

The comparator 146 compares the output signal from the device under test 200 to a prescribed threshold value, and converts the result to a logic value level. The logic comparing section 148 compares the logic signal output by the comparator 146 to the expected value pattern EXP. The result of this comparison is stored in the result recording section 150.

Figure 2:
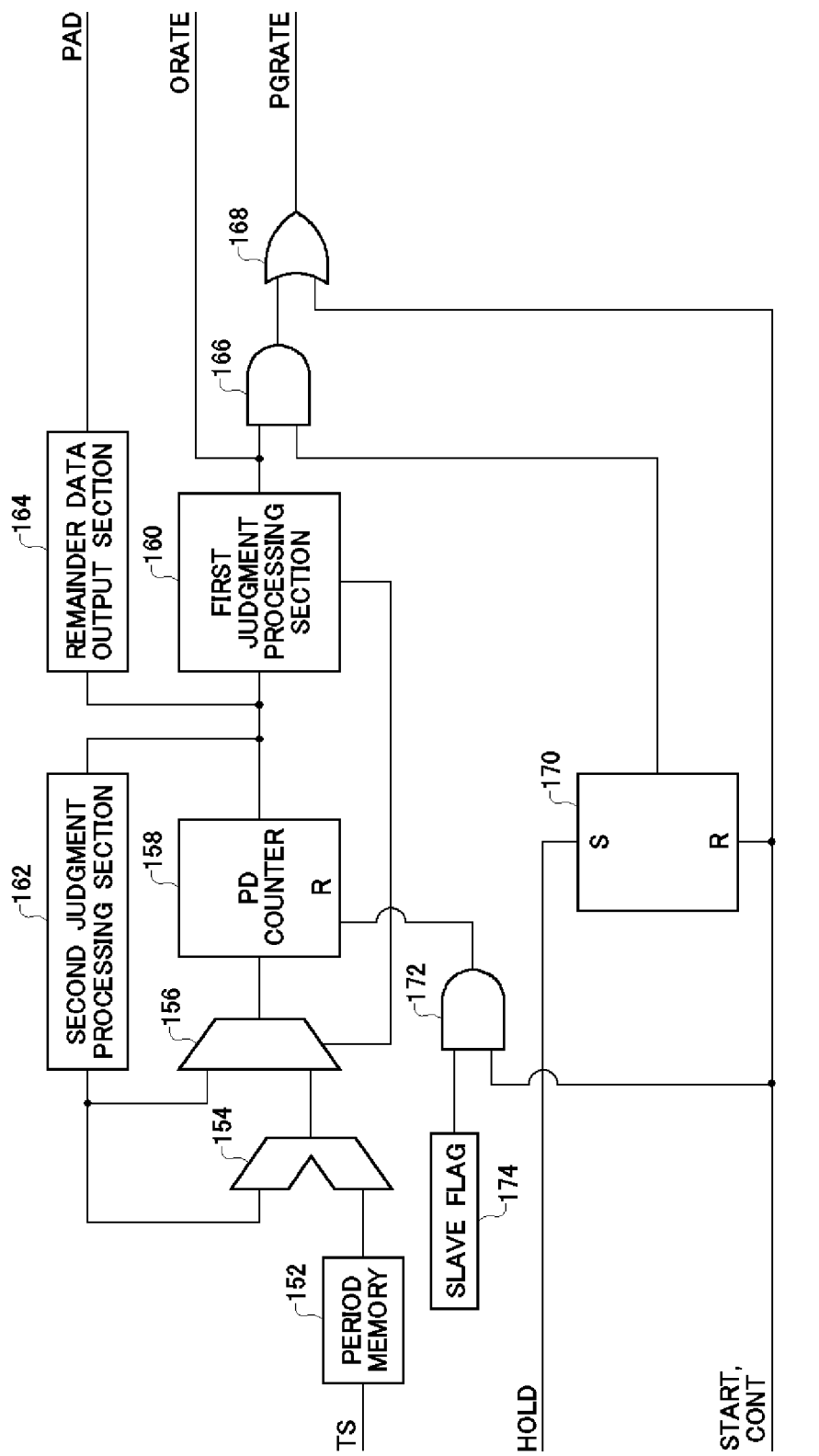
FIG. 2 shows an exemplary block configuration of the slave period signal generating section 122.

FIG. 2 shows an exemplary block configuration of the slave period signal generating section 122. The slave period signal generating section 122 includes a period memory 152, an adder 154, a multiplexer 156, a phase data counter 158, a first judgment processing section 160, a second judgment processing section 162, a remainder data output section 164, an AND circuit 166, an OR circuit 168, an SR flip-flop circuit 170, an AND circuit 172, and a slave flag 174.

The period memory 152 receives the timing setting TS and stores period data indicating the period of the slave period signal. The adder 154 adds the output of the second judgment processing section 162 to the period data stored in the period memory 152. The multiplexer 156 selects the output from the adder 154 or the output from the second judgment processing section 162, according to a signal from the first judgment processing section 160, and outputs the selected output. The output of the multiplexer 156 is supplied to the phase data counter 158 and the phase data is counted.

The phase data counter 158 counts the phase data. The output of the phase data counter 158 is supplied as phase data to the first judgment processing section 160, the second judgment processing section 162, and the remainder data output section 164.

The first judgment processing section 160 judges whether the phase data fulfills a first condition, which is that the phase data be greater than or equal to an operational clock period of the slave period signal generating section 122 and also no greater than double this operational clock period. If the operational clock period is 4 ns, for example, the first judgment processing section 160 judges whether the phase data is greater than or equal to 4 ns and less than 8 ns. When the judgment result indicates that the condition is fulfilled, the first judgment processing section 160 generates the period pulse signal ORATE and adds the period data to the phase data. The function for adding the period data to the phase data is realized by the adder 154 and the multiplexer 156, and therefore the adder 154 and the multiplexer 156 may be included in the first judgment processing section 160.

The second judgment processing section 162 judges whether the phase data fulfills a second condition, which is that the phase data not be equal to zero. When the second condition is fulfilled, i.e. when the phase data is not equal to zero, the second judgment processing section 162 subtracts the operational clock period from the phase data. The remainder data output section 164 outputs the remainder resulting from the phase data being divided by the operational clock period. If the operational clock period is 4 ns and the phase data is 6 ns, for example, the remainder data output section 164 outputs 2 ns.

The AND circuit 166 outputs the AND of the output of the first judgment processing section 160 and the output of the SR flip-flop circuit 170. The OR circuit 168 outputs the OR of (i) the output of the AND circuit 166 and (ii) the CONT signal or a START signal. The output of the OR circuit 168 serves as the period pulse signal PGRATE.

The SR flip-flop circuit 170 works together with the AND circuit 166 to stop the output of the period pulse signal PGRATE in response to receiving a hold signal. The SR flip-flop circuit 170 receives the CONT signal or the START signal, which are examples of control signals, and operates together with the AND circuit 166 to start or resume the output of the period pulse signal PGRATE. The AND circuit 172 receives the CONT signal or the START signal, which are examples of control signals, when the slave flag 174 is raised, and initializes the phase data counter 158. The SR flip-flop circuit 170 and the AND circuit 172 are an example of a stop/resume control section.

With the above configuration, the slave period signal generating section 122 can receive the timing setting TS, the HOLD signal, the CONT signal, or the START signal and generate a slave period signal that includes the period pulse signal ORATE, the period pulse signal PGRATE, and the remainder data PAD. The master period signal generating section is chosen to be in a domain in which the slave flag 174 of the slave period signal generating section 122 is not raised or a domain that does not include the slave flag 174 and the AND circuit 172. In other words, when the CONT signal or the START signal, which are examples of control signals, are received, the master period signal generating section 112 can resume generation of the held master period signal without initializing the phase data of the master period signal.

Figure 3:
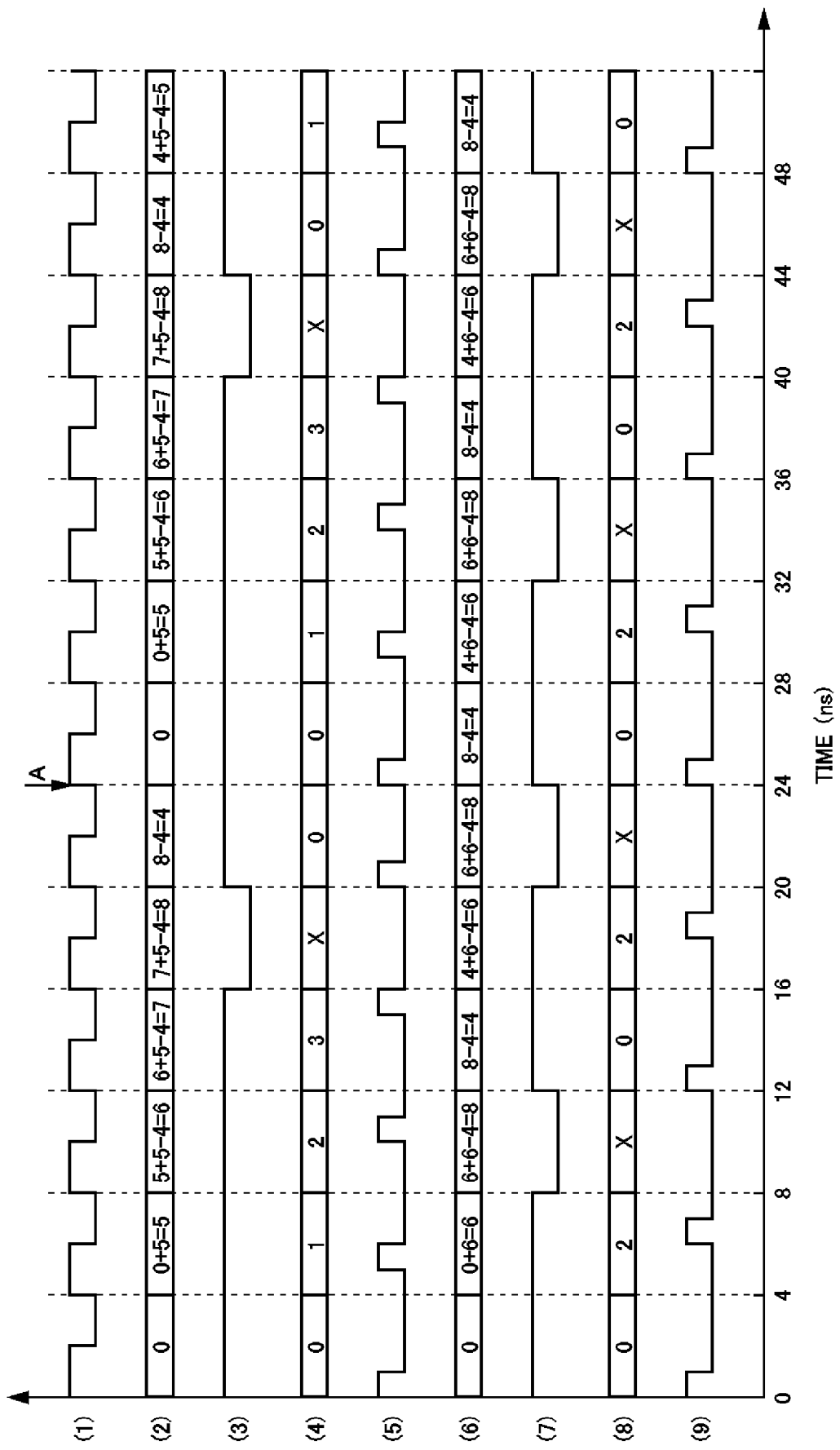
FIG. 3 shows exemplary output of the slave period signal generating section 122 and the master period signal generating section 112.

FIG. 3 shows exemplary output of the slave period signal generating section 122 and the master period signal generating section 112. In FIG. 3, the horizontal axis represents time in as units. Furthermore, (1) shows the operational clock, (2) shows the phase data of the slave domain, (3) shows the period pulse signal ORATE of the slave domain, (4) shows the remainder data PAD of the slave domain, (5) shows the output waveform of the slave domain, (6) shows the phase data of the master domain, (7) shows the period pulse signal ORATE of the master domain, (8) shows the remainder data PAD of the master domain, and (9) shows the output waveform of the master domain.

The operational clock periods of the master domain and the slave domain are both 4 ns, the period signal of the master domain has a 6 ns period, the period signal of the slave domain has a 5 ns period, and the master domain and slave domain each output a periodic waveform that rises at the start of the period pulse signal ORATE and falls 1 ns after rising.

When the slave domain and master domain both start at 0 ns, a process is performed for the operational clock (1) by each domain. Specifically, the phase data and remainder data (2), (4), (6), and (8) are initialized to a value of zero for a 0 ns cycle, and the slave and master phase data (2) and (6) respectively have 5 ns and 6 ns added thereto. At this time, if the phase data is greater than or equal to 4 ns and less than 8 ns, the period pulse signals ORATE (3) and (7) are asserted. At a start (START) or continuation (CONT) timing, the period pulse signals ORATE (3) and (7) are asserted unconditionally.

Since the phase data is not zero, 4 ns is subtracted therefrom and a remainder, which is less than 4 ns, of the phase data is output as the remainder data PAD (4) and (8). Each domain combines the period pulse signal ORATE with the output waveform (5) and (9) from the remainder data PAD, and outputs the result.

The following describes synchronizing of the domains. Synchronization of the domains can be realized using the period signal of the master domain as a reference. Specifically, the master domain is selected to be a domain that generates a signal that does not need to be stopped during testing, such as a domain that supplies a test clock signal to the device under test 200. Next, a timing is selected that has both the period signal of the master domain and the operational clock period as a common multiple, such as the 24 ns timing shown by the arrow A in FIG. 3, and a continuation (CONT) signal for achieving synchronization is applied to the domains. By selecting such a timing, the master domain need not stop operating.

In the slave domain, when the continuation (CONT) signal is received, the phase data (2) is initialized to be zero. As a result, the periodicity of the output waveform (5) is lost, but synchronization with the master domain can be easily achieved. If it is not necessary to maintain the periodicity before and after the slave domain is synchronized, the slave domain can be synchronized with the master domain without any negative effects. In this case, focus is placed on maintaining periodicity for a master domain that has a great need for maintaining periodicity.

As described above, the periodicity can be maintained for a master domain that must maintain the periodicity of its periodic signal, and the slave domain can be synchronized with the master domain with almost no limitations. The above embodiment describes an example in which the master domain and the slave domain have the same operational clock, but the operational clock of the master domain may differ from the operational clock of the slave domain. In this case, the timing at which the continuation (CONT) signal can be received must be a common multiple of the operational clocks of the master and slave domains.

in other words, the master period signal generating section 112 and the slave period signal generating section 122 can receive a control signal, such as the continuation (CONT) signals, at a timing that is a common multiple of (i) the period of the master period signal and (ii) a common multiple period of the operational clocks of the master period signal generating section 112 and the slave period signal generating section 122. If there are a plurality of master period signal generating sections 112, the master period signal generating sections 112 and the slave period signal generating section 122 can receive a control signal, such as the continuation (CONT) signal, at a timing that is a common multiple of (i) the period of the master period signal and (ii) common multiple period of the operational clocks of the slave period signal generating section 122 and each master period signal generating section 112.

Before supplying a control signal, such as the continuation (CONT) signal, the master period signal generating section 112 and the slave period signal generating section 122 may be supplied with hold signals for stopping the master period signal and the slave period signal. The continuation (CONT) signal may then be supplied after it is confirmed that the hold signal has been supplied and the master period signal and slave period signal have stopped. The continuation (CONT) signal may instead be a start (START) signal.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a master domain that includes a master period signal generating section, which generates a master period signal, and that operates based on the master period signal; and
   a slave domain that includes a slave period signal generating section, which generates a slave period signal, and that operates based on the slave period signal, wherein
   the slave period signal generating section includes a phase data counter that counts phase data of the slave signal,
   the master period signal generating section receives a control signal and, upon receiving the control signal, resumes generation of the master period signal, and
   the slave period signal generating section receives the control, signal and, upon receiving the control signal, initializes the phase data counter and resumes generation of the slave period signal.

2. The test apparatus according to claim 1, wherein the slave period signal generating section includes:
   a period memory that stores period data indicating a period of the slave period signal;
   a first judgment: processing section that judges whether the phase data fulfills a first condition, which is that the phase data be greater than or equal to an operational clock period of the slave period signal generating section and no greater than double the operational clock period, and, if the first condition is fulfilled, generates a period pulse signal and adds the period data to the phase data;
   a second judgment processing section that judges whether the phase data fulfills a second condition, which is that the phase data not be zero, and, if the second condition is fulfilled, subtracts the operational clock period from the phase data;
   a data output section that outputs a remainder resulting from the phase data being divided by the operational clock period; and
   a stop/resume control section that receives a hold signal to stop output of the period pulse signal, and receives a control signal to start or resume output of the period pulse signal and to initialize the phase data counter.

3. The test apparatus according to claim 2, wherein
   upon receiving the control signal, the master period signal generating section resumes generation of the master period signal without initializing phase data of the master period signal.

4. The test apparatus according to claim 3, wherein
   the master period signal generating section and the slave period signal generating section receive the control signal at a timing that is a common multiple of (i) a period of the master period signal and (ii) a common multiple period of the operational clocks of the master period signal generating section and the slave period signal generating section.

5. The test apparatus according to claim 3, comprising a plurality of the master period signal generating sections, wherein
   the master period signal generating sections and the slave period signal generating section receive the control signal at a timing that is a common multiple of (i) a period of the master period signal and (ii) a common multiple period of the operational clocks of the slave period signal generating section and each master period signal generating section.

6. A domain synchronization method performed by a test apparatus that tests a device under test, wherein
   the test apparatus includes (i) a master domain that has a master period signal generating, section, which generates a master period signal, and that operates based on the master period signal and (ii) a slave domain that has a slave period signal generating section, which generates a slave period signal, and that operates based on the slave period signal, the domain synchronization method comprising:
   counting phase data of the slave signal by a phase data counter included in the slave period signal generating section;
   receiving a control signal by the master period signal generating section and, upon receiving the control signal, resuming generation of the master period signal; and
   receiving the control signal by the slave period signal generating section and, upon receiving the control signal, initializing the phase data and resuming generation of the slave period signal.

7. The domain synchronization method according to claim 6, further comprising, prior to receiving the control signal by the master period signal generating section and the slave period signal generating section, receiving a hold signal, which stops the master period signal and the slave period signal, by the master period signal generating section and the slave period signal generating section.

8. The domain synchronization method according, to claim 7, further comprising:
   confirming that the master period signal and slave period signal have stopped according to the receiving of the hold signal.

9. The domain synchronization method according to claim 8, wherein
   receiving the control signal by the master period signal generating section and the slave period signal generating section includes receiving the control signal at a timing that is a common multiple of (i) a period of the master period signal and (ii) a common multiple period of the operational clocks of the master period signal generating section and the slave period signal generating section.

* * * * *